(12) United States Patent
Liu

(10) Patent No.: US 8,339,791 B2
(45) Date of Patent: Dec. 25, 2012

(54) POWER SUPPLY UNIT

(75) Inventor: Lei Liu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 296 days.

(21) Appl. No.: 12/848,199

(22) Filed: Aug. 1, 2010

(65) Prior Publication Data

US 2012/0014074 A1    Jan. 19, 2012

(30) Foreign Application Priority Data

Jul. 16, 2010    (CN) .......................... 2010 1 0228499

(51) Int. Cl.
*H05K 5/00* (2006.01)
(52) U.S. Cl. ....................................................... 361/730
(58) Field of Classification Search .................. 439/296, 439/950, 499, 952, 507, 954, 660; 361/730, 361/601, 679.02, 724, 728
See application file for complete search history.

(56) References Cited

U.S. PATENT DOCUMENTS

| | | | |
|---|---|---|---|
| 6,493,233 B1* | 12/2002 | De Lorenzo et al. | 361/752 |
| 8,199,463 B2* | 6/2012 | Lu et al. | 361/601 |
| 2010/0177472 A1* | 7/2010 | Chang | 361/679.02 |

* cited by examiner

*Primary Examiner* — Jeremy Norris
*Assistant Examiner* — Tremesha S Willis
(74) *Attorney, Agent, or Firm* — Altis Law Group, Inc.

(57) ABSTRACT

A power supply unit includes a box, a circuit board, and a power connector. A first connector is set on the sidewall of the box and electrically connected to a rectifier of the box. The circuit board includes a number of output terminals set on a first side, and a second connector set on a second side and electrically connected to the first connector. Each of the output terminals is connected to the second connector. The power connector is selectively connected to some of the output terminals via a cable and connected to a power interface, the power connector is connected to the first end of the cable, and the second end of the cable is selectively connected to corresponding output terminals according to a required input voltage of different motherboards, the power connector outputs power signals to the motherboard and receives control signals from the motherboard.

9 Claims, 3 Drawing Sheets

POWER SUPPLY UNIT

BACKGROUND

1. Technical Field

The present disclosure relates to a power supply unit.

2. Description of Related Art

At present, a power supply can only provide a kind of output voltage, such as 12 volts, to a computer motherboard for testing the motherboard. However, different computer motherboards will have different voltage needs, therefore multiple power supplies are needed when testing involves different computer motherboards, which is costly. Therefore, there is room for improvement in the art.

BRIEF DESCRIPTION OF THE DRAWINGS

Many aspects of the embodiments can be better understood with reference to the following drawing. The components in the drawing are not necessarily drawn to scale, the emphasis instead being placed upon clearly illustrating the principles of the present embodiments.

DETAILED DESCRIPTION

The disclosure, including the drawings, is illustrated by way of example and not by limitation. It should be noted that references to "an" or "one" embodiment in this disclosure are not necessarily to the same embodiment, and such references mean at least one.

Figure 1:
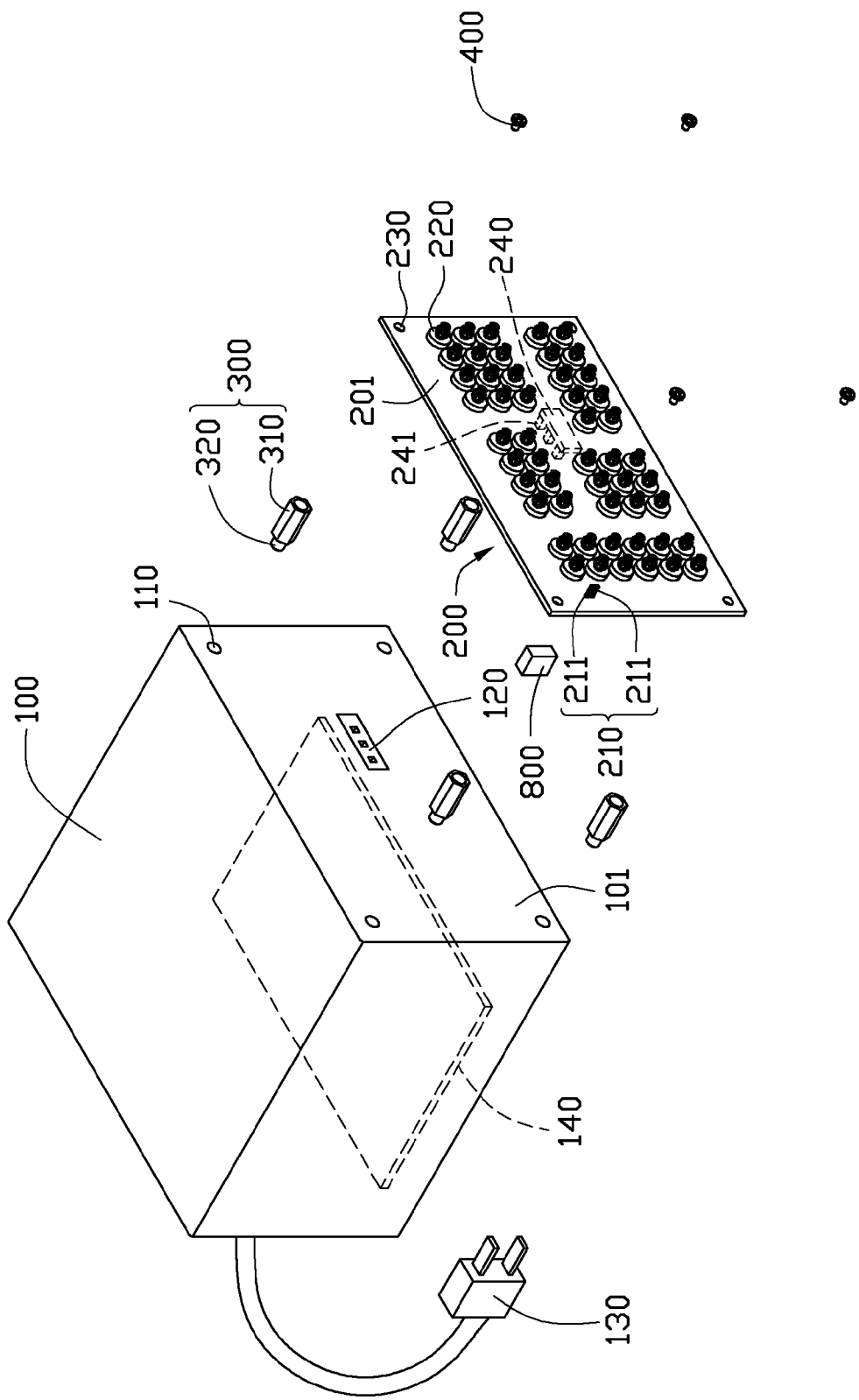
FIG. 1 is an exploded, isometric view of an exemplary embodiment of a power supply unit, the power supply unit includes a circuit board.
Figure 2:
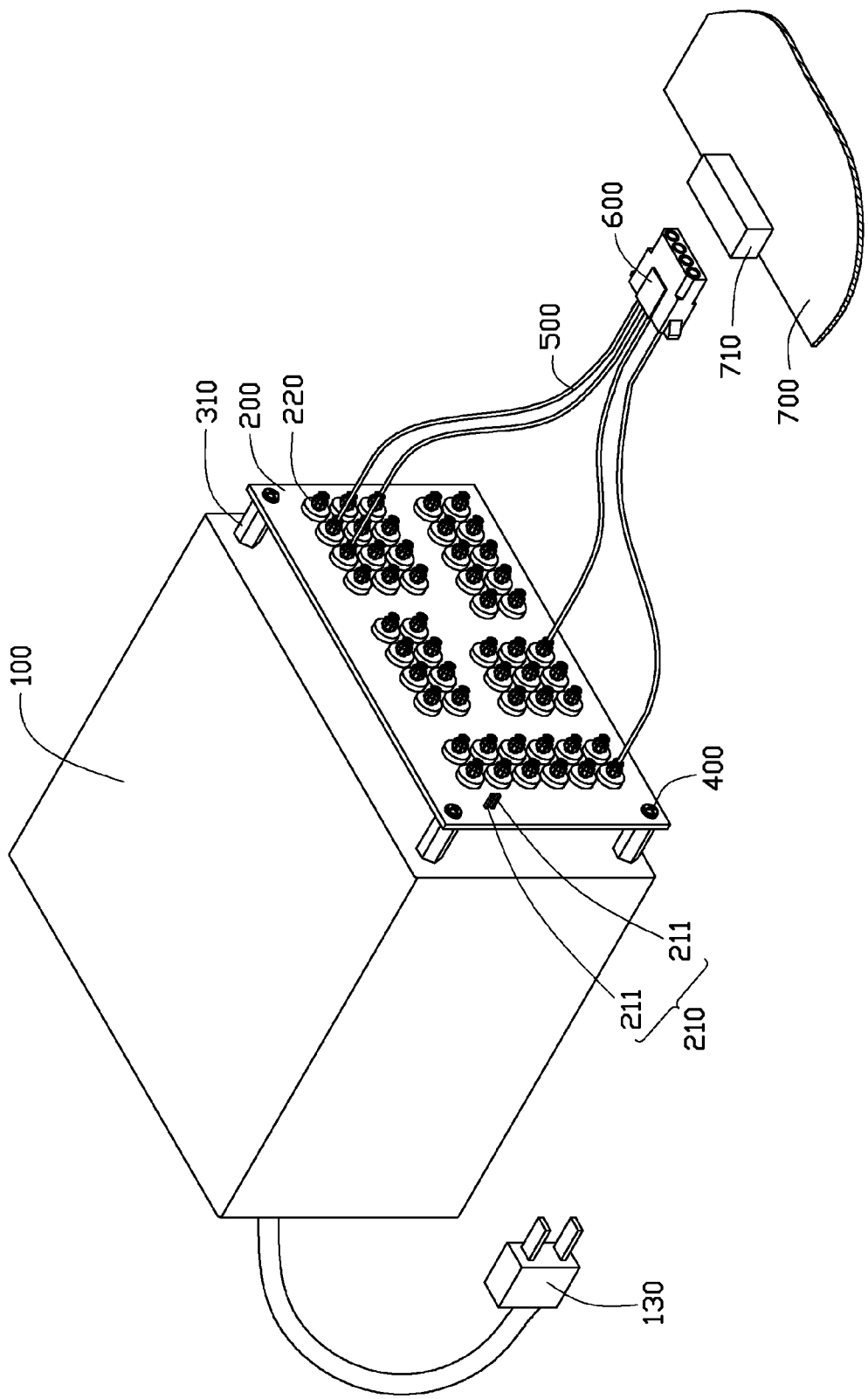
FIG. 2 is an assembled, isometric view of the power supply unit of FIG. 1.

Referring to FIGS. 1 and 2, an exemplary embodiment of a power supply unit includes a box 100, a circuit board 200, a plurality of studs 300, and a plurality of screws 400. The box 100 has six sidewalls and contains a rectifier 140. Any rectifier, such as might be found in a computer, may be used as the rectifier 140. Four corners of a sidewall 101 of the box 100 define four positioning holes 110. A connector 120 is set on a center of the sidewall 101, and electrically connected to the rectifier 140 of the box 100. The connector 120 is configured to output power signals to a motherboard 700 and receive control signals from the motherboard 700. The box 100 is connected to a power plug 130 which is configured to be connected to an alternating current (AC) power source (not shown).

The circuit board 200 includes a startup apparatus 210, a plurality of output terminals 220, and a connector 240. The circuit board 200 defines four fixing holes 230 in four corners. The startup apparatus 210 and the output terminals 220 are formed on a first side 201 of the circuit board 200. The connector 240 is set on a second side opposite to the side 201 of the circuit board 200, and is configured to be connected to the connector 120 of the box 100. The startup apparatus 210 includes two power pins 211, which are connected to two corresponding pins 241 of the connector 240 of the circuit board 200. The output terminals 220 are grouped in different areas of the first side 201 of the circuit board 200 according to output voltage, for example, the output terminals 220 that output 5 volts are grouped in a same area. Each output terminal 220 is connected to a corresponding pin 241 of the connector 240 of the circuit board 200.

Figure 3:
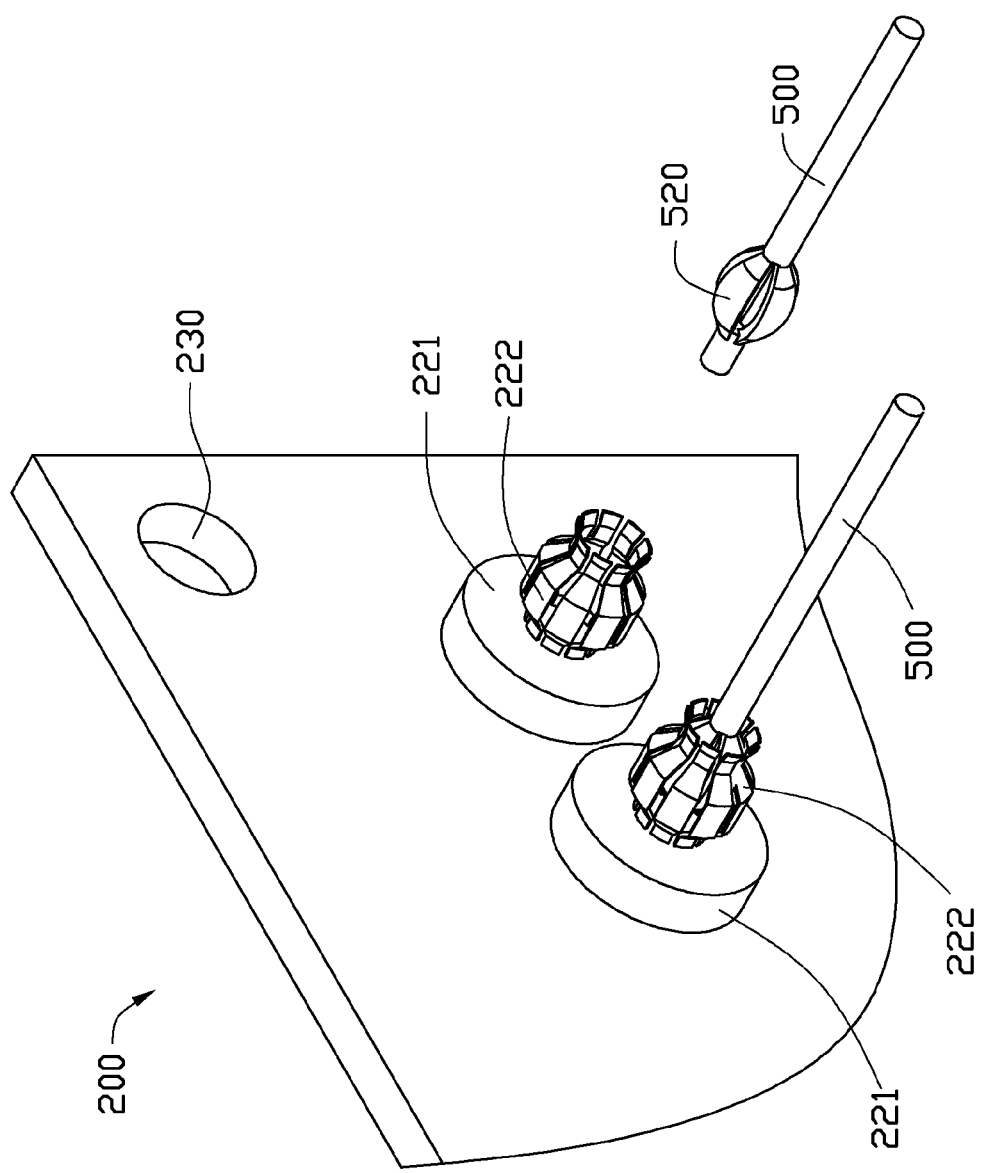
FIG. 3 is a partial, enlarged view of the circuit board of FIG. 1.

Referring to FIG. 3, each output terminal 220 includes a base 221 extending from the circuit board 200 and a plurality of resilient inductive pieces 222. First ends of the resilient inductive pieces 222 are fixed on the base 221 and arranged in a circle on the base 221 opposite to the circuit board 200. The resilient inductive pieces 222 and the base 221 bound an accommodating space (not labeled), to receive a cable 500. Diameters of a first end of the accommodating space adjacent to the base 221 and a second end of the accommodating space away from the base 221 are less than a diameter of a center of the accommodating space. Each stud 300 includes a first fixing portion 310 and a second fixing portion 320 connected to a first end of the first fixing portion 310. A diameter of the first fixing portion 310 is larger than a diameter of the second fixing portion 320. A distal end of the second fixing portion 320 is fixed in a corresponding positioning hole 110 of the box 100.

A first end of the cable 500 is connected to a power connector 600, which is connected to a power interface 710 of the motherboard 700. A plurality of petal-shaped inductive protrusions 520 is set on a second end opposite to the first end of the cable 500, and surrounds the cable 500.

In assembly, the second fixing portion 320 of each stud 300 is fixed in the corresponding positioning hole 110 of the box 100. The connector 240 of the circuit board 200 is connected to the connector 120 of the box 100. The screws 400 extend through the corresponding fixing holes 230 of the circuit board 200 to screw in the first fixing portion 310 of the corresponding stud 300, to fix the circuit board 200 to the box 100.

Before use, a type of the power connector 600 connected to the first end of the cable 500 can be selected according to a power interface 710 of the motherboard 700, to test different motherboards, and then the second end of the cable 500 is selectively inserted into a corresponding output terminal 220 of the circuit board 200 according to a required input voltage of different motherboards. The inductive protrusions 520 of the cable 500 are received in the accommodating space of the output terminal 220, to electrically connect the cable 500 to the circuit board 200. In use, the power connector 600 is connected to the power interface 710 of the motherboard 700. A jump block 800 is connected to the two power pins 211 of the circuit board 200, to power on the power supply unit. The power supply unit outputs different voltages to different motherboards by the output terminals 220 of the circuit board 200. In other embodiments, the jump block can be disused.

The power supply unit can provide different voltages to different motherboards to satisfy test requirement, which is inexpensive and convenient.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A power supply unit comprising:
   a box comprising a sidewall, a rectifier enclosed by the sidewall, and a first connector being set on the sidewall and electrically connected to the rectifier;
   a circuit board, mounted on the sidewall, comprising a plurality of output terminals set on a first side of the circuit board opposite to the sidewall of the box, and a second connector being set on a second side of the circuit board facing the sidewall of the box and electrically connected to the first connector of the box, each of the plurality of output terminals connected to a corresponding pin of the second connector; and a power connector selectively connected to some of the plurality of output terminals via a cable and also connected to a power interface of a motherboard, wherein the power connector is connected to a first end of the cable, and a second end of the cable is selectively connected to corresponding output terminals of the circuit board according to a required input voltage of different motherboards, the power connector outputs power signals from the box to the motherboard and receives control signals from the motherboard to the box;

wherein a plurality of inductive protrusions is set on the cable opposite to the power connector, and surrounds the cable, each output terminal comprises a base extending from the circuit board and a plurality of resilient inductive pieces, first ends of the resilient inductive pieces are fixed on the base and arranged in a circle on the base opposite to the circuit board, the resilient inductive pieces and the base bound an accommodating space, diameters of a first end of the accommodating space adjacent to the base and a second end of the accommodating space away from the base are less than a diameter of a center of the accommodating space, to receive the plurality of inductive protrusions of the cable, to electrically connect the cable to the output terminal.

2. The power supply unit of claim 1, further comprising four studs, wherein the sidewall of the box defines four positioning holes in four corners, the circuit board defines four fixing holes in four corners corresponding to the positioning holes of the box, first ends of the four studs are fixed in the corresponding positioning holes of the box, four screws extend through the corresponding fixing holes of the circuit board and fixed in second ends of the corresponding studs, to fix the circuit board to the box.

3. The power supply unit of claim 2, wherein each of the studs comprises a first fixing portion and a second fixing portion connected to the first fixing portion, a diameter of the first fixing portion is larger than a diameter of the second fixing portion, the second fixing portion is fixed in a corresponding positioning hole of the box, the corresponding screw extends through the corresponding fixing hole of the circuit board and fixed in the first fixing portion.

4. The power supply unit of claim 1, further comprising a startup apparatus, wherein the startup apparatus is set on the first side of the circuit board and comprises two power pins connected to two corresponding pins of the second connector of the circuit board, a jump block is connected to the two power pins of the startup apparatus of the circuit board, to power on the power supply unit.

5. A power supply unit comprising:
a rectifier;
a first connector being electrically connected to the rectifier;
a circuit board comprising a plurality of output terminals set thereon;
a second connector electrically connected to the first connector, each of the plurality of output terminals connected to a corresponding pin of the second connector; and
a power connector selectively connected to some of the plurality of output terminals via a cable and also connected to a power interface of a motherboard, wherein the power connector is connected to a first end of the cable, and a second end of the cable is selectively connected to corresponding output terminals of the circuit board according to a required input voltage of different motherboards, the power connector outputs power signals to the motherboard and receives control signals from the motherboard to the box;

wherein a plurality of inductive protrusions is set on the cable opposite to the power connector, and surrounds the cable, each output terminal comprises a base extending from the circuit board and a plurality of resilient inductive pieces, first ends of the resilient inductive pieces are fixed on the base and arranged in a circle on the base opposite to the circuit board, the resilient inductive pieces and the base bound an accommodating space, diameters of a first end of the accommodating space adjacent to the base and a second end of the accommodating space away from the base are less than a diameter of a center of the accommodating space, to receive the plurality of inductive protrusions of the cable, to electrically connect the cable to the output terminal.

6. The power supply unit of claim 5, wherein the first connector is set on a sidewall of a box, the box comprises a sidewall, a rectifier enclosed by the sidewall, the circuit board is mounted on the sidewall of the box, the plurality of output terminals is set on a first side of the circuit board opposite to the sidewall of the box, and the second connector is set on a second side of the circuit board facing the sidewall of the box.

7. The power supply unit of claim 5, further comprising four studs, wherein the sidewall of the box defines four positioning holes in four corners, the circuit board defines four fixing holes in four corners corresponding to the positioning holes of the box, first ends of the four studs are fixed in the corresponding positioning holes of the box, four screws extend through the corresponding fixing holes of the circuit board and fixed in second ends of the corresponding studs, to fix the circuit board to the box.

8. The power supply unit of claim 7, wherein each of the studs comprises a first fixing portion and a second fixing portion connected to the first fixing portion, a diameter of the first fixing portion is larger than a diameter of the second fixing portion, the second fixing portion is fixed in a corresponding positioning hole of the box, the corresponding screw extends through the corresponding fixing hole of the circuit board and fixed in the first fixing portion.

9. The power supply unit of claim 5, further comprising a startup apparatus, wherein the startup apparatus is set on the first side of the circuit board and comprises two power pins connected to two corresponding pins of the second connector of the circuit board, a jump block is connected to the two power pins of the startup apparatus of the circuit board, to power on the power supply unit.

* * * * *